United States Patent
Cline

(10) Patent No.: US 6,294,926 B1
(45) Date of Patent: Sep. 25, 2001

(54) VERY FINE-GRAIN FIELD PROGRAMMABLE GATE ARRAY ARCHITECTURE AND CIRCUITRY

(75) Inventor: Ronald L. Cline, Albuquerque, NM (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/354,607

(22) Filed: Jul. 16, 1999

(51) Int. Cl.$^7$ ................................................. H03K 19/177
(52) U.S. Cl. ............................................................. 326/39
(58) Field of Search ................... 326/38, 39, 40, 326/41; 257/369

(56) References Cited

U.S. PATENT DOCUMENTS

| | | | |
|---|---|---|---|
| 5,001,368 | 3/1991 | Cliff et al. | 307/465 |
| 5,019,736 | 5/1991 | Furtek | 326/39 |
| 5,051,917 | * 9/1991 | Gould et al. | 257/369 |
| 5,055,718 | 10/1991 | Galbraith et al. | 307/465 |
| 5,594,363 | 1/1997 | Freeman et al. | 326/39 |
| 5,598,109 | * 1/1997 | Leong et al. | 326/41 |
| 5,720,031 | 2/1998 | Lindsay | 395/183.18 |
| 5,815,003 | * 9/1998 | Pedersen | 326/39 |
| 5,831,448 | 11/1998 | Kean | 326/41 |
| 5,872,380 | * 2/1999 | Rostoker et al. | 257/369 |
| 5,889,411 | * 3/1999 | Chaudhary | 326/39 |
| 6,054,873 | * 4/2000 | Laramie | 326/39 |
| 6,107,822 | * 8/2000 | Mendel et al. | 326/39 |

FOREIGN PATENT DOCUMENTS

| | | | |
|---|---|---|---|
| 0398552 A2 | 11/1990 | (EP) | H03K/19/173 |
| 0398552 A3 | 11/1990 | (EP) | H03K/19/173 |

OTHER PUBLICATIONS

Actel Technology Backgrounder: SX Family of FPGAS, p. 3–11.
Motorola Semiconductor General Information.
pASIC 3 FPGA Family, pp. 2–2 t 2–14.
http://patents/uspto.gov/cgi–bin/;Hierarchically Connectable Configurable Cellular Array, pps. 1–40.
http://www.gatefield.com/products/Devices/gf260f.html, GF260F Programmable ASICs Programmable ASICs Product Brief.

* cited by examiner

*Primary Examiner*—Trong Phan

(57) ABSTRACT

A very fine-grained gate array cell is provided that includes a two-input logic device and a cascade NAND gate with buffered output. The NAND gate accepts a cascade input from another cell, and the cascade output of the NAND gate is provided as a cascade input to the other cell to facilitate the efficient implementation of cross-coupled devices. Each cell contains integral routing paths that facilitate a "sea of cells" layout approach. To ease the routing task, the output of each gate array cell is pre-wired so as to facilitate a programmed interconnection to each logic input of adjacent cells, near-adjacent cells, and far cells, and the aforementioned cascade interconnection with adjacent upper and lower cells. This configuration allows adjacent and near-adjacent cells to be easily interconnected to form macro cells that conform to higher level functional blocks. The gate array does not contain explicit routing channels; routing is effected using the prewired routing that is integral with each gate array cell.

6 Claims, 10 Drawing Sheets

VERY FINE-GRAIN FIELD PROGRAMMABLE GATE ARRAY ARCHITECTURE AND CIRCUITRY

BACKGROUND OF THE INVENTION

1. Field of the Invention

This invention relates to the field of integrated circuit design, and in particular to programmable gate arrays.

2. Description of the Related Art

Gate array integrated circuits are common in the art, and allow for the design of application specific integrated circuits via an interconnection among predefined and prefabricated gate array cells. Field Programmable Gate Array (FPGA) allow for the creation, or programming, of the interconnection among the cells at a user's site, using commonly available programming devices. The interconnections may be created by fusing links, by enabling selected switches, by storing a pattern that controls available switches, and so on. U.S. Pat. No. 5,594,363, "Logic Cell and Routing Architecture in a Field Programmable Gate Array, filed Jan. 14, 1997 for Freeman et al, incorporated by reference herein, discloses a technique for routing among cells that includes switch matrices that connect select vertical wires to horizontal wires, based on the contents of a nonvolatile memory cell. Typically, a designer provides a description of the function to be performed, and a computer-aided-design (CAD) program determines the interconnect programming required to effect that function. The description may be a logic diagram, a data flow diagram, a state diagram or table, a sequence of instructions in a structured design language, and so on.

The conversion from a description of the design to the programming of a gate array is dependent upon the contents of the gate array. If the cells of the gate array are high level blocks, such as counters, parity generators, and the like, then the amount of programming required is limited to the interconnections among these large, or coarse-grain, cells. If, on the other hand, the cells of the gate array are low level blocks, such as gates, latches, and the like, then the amount of programming is significantly higher, because these smaller, or fine-grain, cells need to be interconnected to effect the higher level functions, such as the aforementioned counters and parity generators. In some designs, higher circuit densities can be achieved via the use of fine-grain cells, because simpler functions can be implemented with a small low-level cell, rather than with a larger high-level cell whose higher level functions go unused. Conversely, some complex designs cannot be efficiently embodied in a fine-grain gate array, because the amount of interconnection required among the low-level cells exceed the capacity of the gate array. In some cases, the interconnections may be within the capacity of the gate array, but the resultant routing paths among the low-level cells exceed the propagation delay or skew limits required to effect the intended function. For optimal performance, the fine-grained cells that are related to a particular function should be co-located, but this often places constraints on the routing for connections among functional blocks when such co-locations create routing "bottlenecks".

Various architectures have been proposed to optimize the tradeoffs among circuit density, routing efficiency, performance limits, and the like. U.S. Pat. No. 5,001,368, "Configurable Logic Array", issued Mar. 19, 1991 to Cliff et al, for example, notes the deficiencies of a gate array architecture that only includes NAND gate cells, and specifies the inclusion of additional circuitry to include a latch function in each cell. The need for a latch function is a common theme in conventional gate array cell design, because if the devices that form the latch are interconnected via long routing paths, or via intermediate buffers, the phase shift that is introduced could cause the latch to oscillate. Typical gate array cells commonly include at least one latch, sometimes more. U.S. Pat. No. 5,055,718, "Logic Module with Configurable Combinational and Sequential Blocks", issued Oct. 8, 1991 to Galbraith et al, specifies a configurable gate array cell that can effect "a wide variety" of combinational and sequential logic functions, ranging from a simple NAND function to an edge-triggered flip-flop with asynchronous reset. As noted above, however, the same amount of cell area is consumed regardless of whether a simple NAND gate or complex flip-flop is being implemented.

To ease the routing task, U.S. Pat. No. 5,831,448, "Function Unit for Fine-Grained FPGA", issued Nov. 3, 1998 to Kean et al, specifies the organization of configurable gate array cells into a hierarchy of blocks, such as a 4×4 cell block, a 4×4 organization of the 4×4 cell block, and so on. Each level of the hierarchy includes a routing path specific to that level, thereby allowing for a routing strategy that is logarithmic in terms of distance. The aforementioned U.S. Pat. No. 5,594,363 also discloses the use of hierarchical routing channels. The Motorola MPA 1000 family of commercially available FPGAs provides multi-functioned configurable gate array cells that are organized in zones of 10×10 cells and ancillary components, such as port cells and clock distribution cells, the zones being organized into 4 quadrants. A hierarchy of routing paths are provided: a local interconnect provides the connection among adjacent and near-adjacent cells; a medium interconnect provides the interconnection among zones; and a global interconnect provides the interconnection among quadrants, as well as global signal and bus routing.

Although hierarchical routing is effective for managing interconnection complexities, a fixed hierarchy of cells can lead to inefficiencies when the cell hierarchy does not conform to the hierarchy of functions used in the design. Similarly, although multi-functioned configurable cells ease the routing task by containing medium-complexity devices such as flip-flops, the achievable circuit density is directly affected by the number of low-level functions in the design, because regardless of simplicity, they will each consume a medium-complexity, medium-sized cell. Additionally, the partitioning of the area into zones of logic elements and zones of routing paths can also lead to inefficiencies when available logic elements are made inaccessible due to a commitment of all available routing paths to other logic elements, or preferred routing paths are made unaccessible to particular logic elements.

BRIEF SUMMARY OF THE INVENTION

It is an object of this invention to provide a gate array architecture having a very fine grain cell configuration. It is a further object of this invention to provide a gate array architecture that facilitates efficient routing among cells. It is a further object of this invention to provide a gate array architecture that supports a user definable hierarchy of gate array cells. It is a further object of this invention to provide a gate array cell that facilitates the creation of user definable macro cells.

These objects and others are achieved by providing a very fine-grained gate array cell, and by providing a cell layout that facilitates a "sea of cells" allocation and routing technique. A preferred gate array cell includes a well defined "core" element whose replication allows for embodiments of logic with minimal unused potential. In a preferred embodiment, the gate array cell comprises a two-input logic device and a cascade NAND gate with buffer. The NAND gate accepts a cascade input from another cell, and the cascade output of the NAND gate is provided as a cascade input to the other cell to facilitate the efficient implementation of cross-coupled devices. In another preferred embodiment, the gate array cell comprises a three-input neural cell. To ease the routing task, in these preferred embodiments, the output of each gate array cell is prewired so as to facilitate a programmed interconnection to each logic input of adjacent cells, near-adjacent cells, and far cells, and the aforementioned cascade connection to adjacent upper and lower cells. This configuration allows adjacent and near-adjacent cells to be easily interconnected to form macro cells that conform to higher level functional blocks. The gate array in a preferred embodiment does not contain explicit routing channels; routing is effected using the prewired routing that is integral with each gate array cell.

BRIEF DESCRIPTION OF THE DRAWINGS

The invention is explained in further detail, and by way of example, with reference to the accompanying drawings wherein.

DETAILED DESCRIPTION OF THE INVENTION

A preferred embodiment of a gate array cell in accordance with this invention includes a core element having a well defined function that can be used as a building block for a logic system without introducing substantial allocation or routing inefficiencies. As is known in the art, any logic device can be created by using only NAND gates, or only NOR gates. However, a design created from a combination of core single gate cells, such as NAND gates or NOR gates, will require a substantial number of routing paths. As noted above, a design created from a combination of complex multi-function cells will often leave a substantial number of gates unused, each time a low-level function, such as a NAND or NOR function, is allocated one of the complex multi-function cells to effect the low-level function. Thus, a preferred embodiment of the gate array cell includes sufficient functional complexity to minimize the routing requirements among cells, yet provides a core functionally that minimizes unused logic elements for low-level functions.

Figure 1:
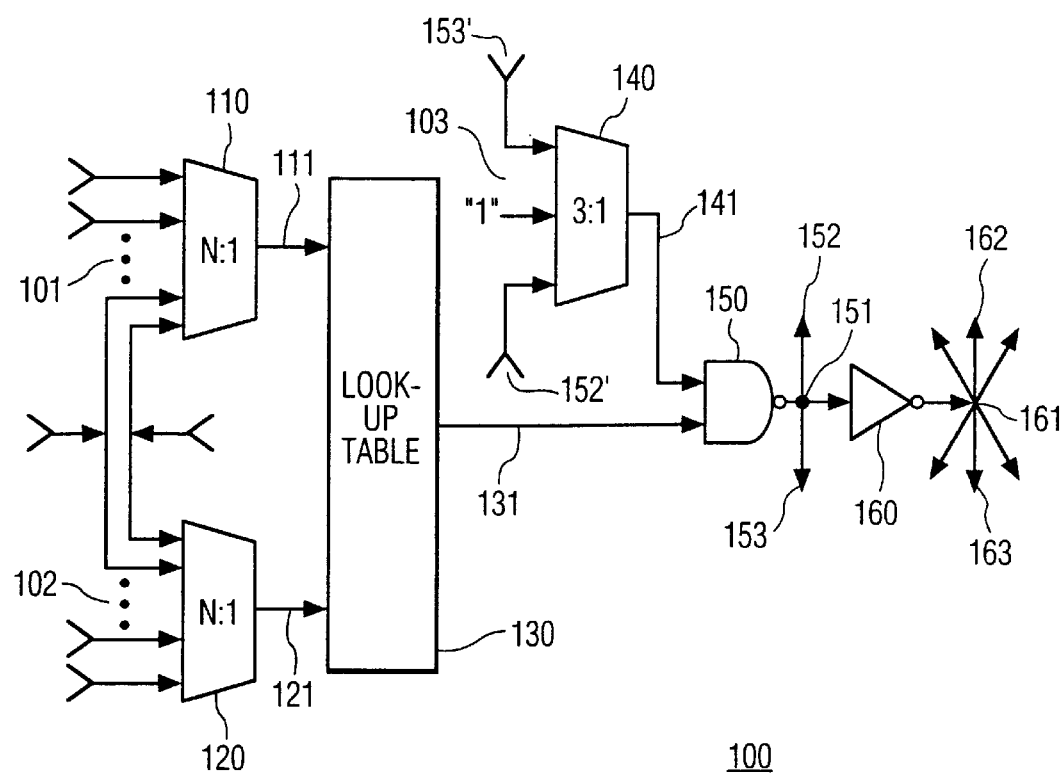
FIG. 1 illustrates an example gate array cell logic diagram in accordance with this invention.

FIG. 1 illustrates an example logic diagram of a gate array cell 100 in accordance with this aspect of the invention. The cell 100 includes four programmable components: multiplexers 110, 120, and 140, and lookup-table 130. Each of the multiplexers 110, 120, and 140 have a plurality of inputs 101, 102, and 103, and a single output 111, 121, and 141 respectively. The programming of each multiplexer determines which of the plurality of inputs are connected to the output. A variety of techniques are commonly available for programming the multiplexers. Fused-links can be employed to connect or disconnect each input to and from the output; pass-transistors can form switches that are controlled by a programmable memory device; electrical-erasable transistors can likewise form programmable switches, and so on.

Figure 3:
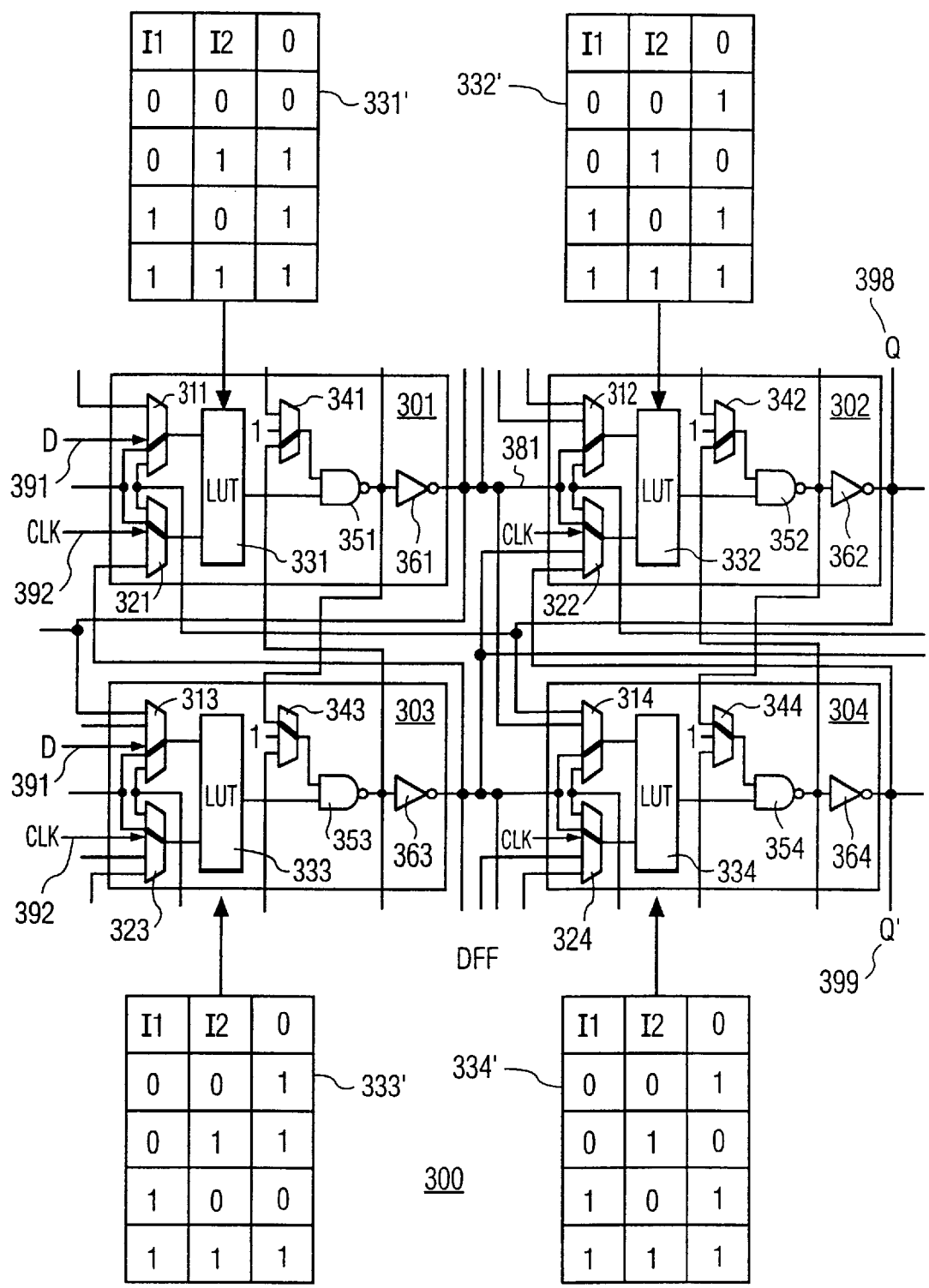
FIG. 3 illustrates an example multi-cell flip-flop configuration in accordance with this invention.

The output 111, 121 of the multiplexers 110, 120 form the input to a two-input lookup-table 130. The lookup-table 130 is programmed to produce the desired output 131 for each of the four combinations of input logic values. That is, for example, to implement an AND function, the table entry corresponding to a 1-1 input combination is programmed to a logic 1, and the table entries corresponding to each of the other three input combinations (0-0, 0-1, 1-0) are programmed to a logic 0. Because all four input combinations have a programmable resultant output, all logic functions, including those commonly depicted as having an inverted input, are achievable. FIG. 3, discussed further, illustrates a variety of programmed logic functions. Thus, as illustrated, the programming of the multiplexers 110 and 120 and the lookup-table 130 provides for the implementation of any logic combination of any input 101 and any input 102.

The multiplexer 140 is programmed to select as an output 141, one of two logic inputs 152' and 153', or a fixed logic 1 value. As discussed further below, the inputs 152' and 153' correspond to intermediate output signals of adjacent cells, and facilitate the formation of cross-coupled gates and cascaded gates that are common to a variety of higher level logic blocks, such as flip-flops, adders, counters, and the like.

The NAND gate 150 combines the lookup-table output 131 and the multiplexer output 141 to form an intermediate output 151. An inverting buffer 160 inverts the intermediate output 151 to form a cell output 161. Because the NAND gate 150 is commonly used in a cascade gate arrangement, it is termed herein the cascade gate 150, and its output is termed the cascade output 151, for ease of reference and understanding.

Figure 2:
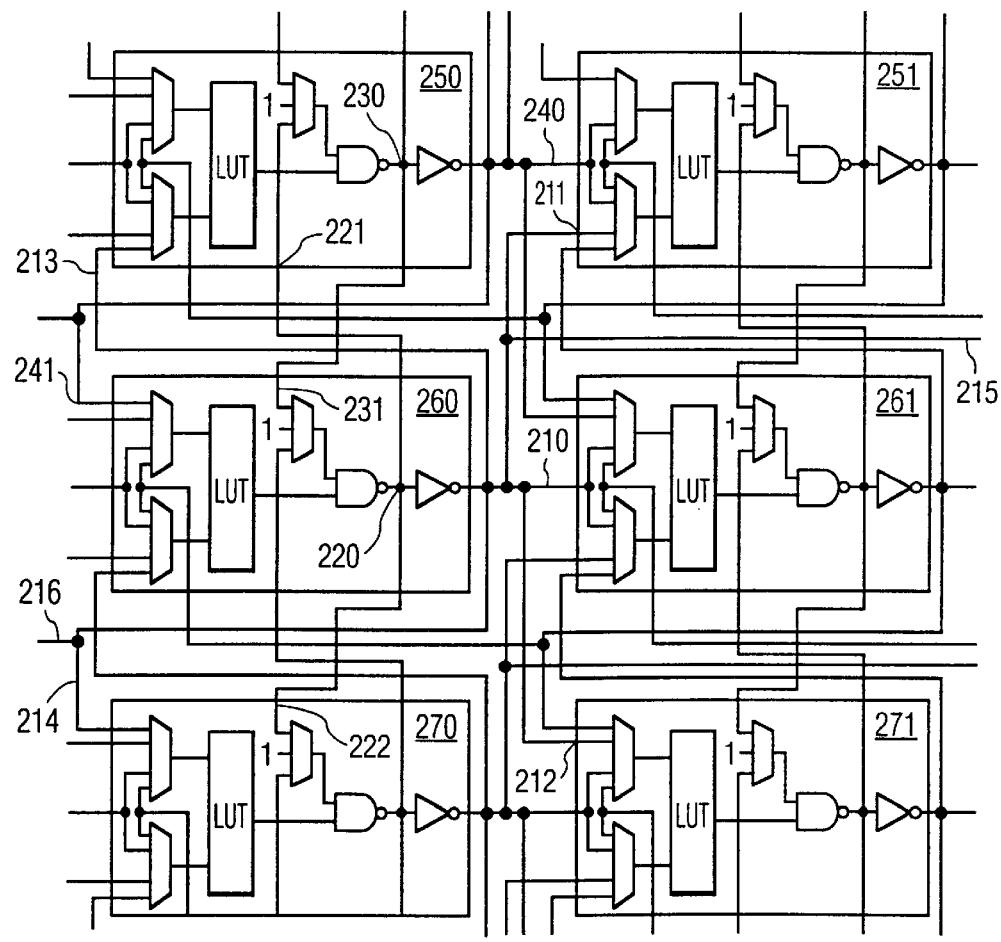
FIG. 2. illustrates an example multi-cell logic diagram in accordance with this invention.

Illustrated in FIG. 1 are fanout arrows 151–153, 161–163 at the cascade output 151 and cell output 161, respectively. These fanout arrows serve to illustrate that, in accordance with this invention, the outputs 151, 161 of each cell 100 are prewired to provide the inputs 101, 102, 103 of other cells. FIG. 2 illustrates an example prewired configuration of a plurality of cells 250, 251, 260, 261, 270, and 271. The output of cell 260, corresponding to a cell output node 161 of FIG. 1, is labeled 210 in FIG. 2 and provides an input to adjacent cell 261. This cell output 210 is also prewired to provide an input 211, 212, 213, and 214, to cells 251, 271, 250, and 270, respectively. In like manner, the cascade output 220 of cell 260 is prewired to provide the aforementioned cascade input 221 and 222 (nodes 152' and 153' in FIG. 1) to cells 250 and 270, respectively. In accordance with this invention, the gate array comprises a plurality of replicated cells that each have a prewired fanout to other cells. The example fanout of cell 260 is provided for illustrative purposes, and alternative arrangements would be evident to one of ordinary skill in the art in view of this disclosure. In general, the prewiring of adjacent left-right-upper-lower cells facilitate the creation of compact low and medium level logic blocks, such as latches and flip flops. Illustrated in FIG. 2, diagonally adjacent cells are prewired as well, and as illustrated by the fanout lines 215 and 216, farther separated cells are also preferably prewired. In like manner, each input to cell 260 is prewired from another cell, as illustrated by inputs 231, 241 from the cascade output 230 and cell output 240 nodes of cell 250. In a preferred embodiment, in addition to immediately adjacent cells, the fanout of a cell output node 210, 240 extends to cells that are 2, 4, and 8 cells beyond the cell in each of the left, right, up, and down directions.

FIG. 3 illustrates how the example prewired fanout of cells of FIG. 2 facilitate the creation of a higher level logic block 300, a D-flip-flop, using four cells 301–304. To create the logic block 300, each of the multiplexers and lookup-tables of each logic cell 301–304 are programmed to effect the desired logic function, as discussed above. This programming is illustrated in FIG. 3 by the connecting lines within each multiplexer 311–314, 321–324, and 341–344, and by the truth tables 331'–334' corresponding to the lookup-table 331–334 of each cell 301–304. That is, in cell 301, the first multiplexer 311 connects the D 391 input to the first input of the lookup-table 331, and the second multiplexer 321 connects the CLK 392 input to the second input of the lookup-table 331.

The lookup-table 331 effects the logic function described by the truth table 331'. By convention, the upper multiplexer input is termed I1 in the truth table, the other input is I2. In this example, the truth table 331' corresponds to a simple OR function. Thus, the programming of the multiplexers 311 and 321 and the lookup-table 331 provide the OR of D 391 (I1) and CLK 392 (I2). In similar manner, the programming of the multiplexers 313 and 323 and the lookup-table 333 provide the OR of CLK 392 (I2) with the inversion of D 391 (I1). The programming of the multiplexers 312 and 322 and the lookup-table 332 provide the OR of the output 381 (I1) of cell 301 with the inversion of CLK 392 (I2), and the programming of the multiplexers 314 and 324 and the lookup-table 334 provide the OR of the output 383 of cell 303 (I1) with the inversion of CLK 392 (I2). Not illustrated, the CLK signal 392 may be provided by a global clock signal that is prewired to be accessible within each cell 100 of the gate array. The D signals 391–392 may come from another cell, and may be provided to each cell 301, 303 as a fanout of the output of the other cell.

The programming of multiplexers 341–344 is illustrated in FIG. 3 as providing for cross-coupled gates. That is, the programming of multiplexers 341 and 343 provide for a cross-coupling of the cascade gates 351 and 353, and the programming of multiplexers 342 and 344 provide for a cross-coupling of the cascade gates 352 and 354. The output Q 398, Q' 399 of the cells 302, 303, respectively, can be shown to be the output of a conventional positive edge triggered D-flip-flop, having a clock CLK 392, and data input D 391. Note that, in accordance with this invention, the prewiring of the cascade output of each cell to a cascade input of each upper and lower adjacent cell provides for an efficient and compact implementation of a latch device having minimal interconnect path delays.

Figure 11:
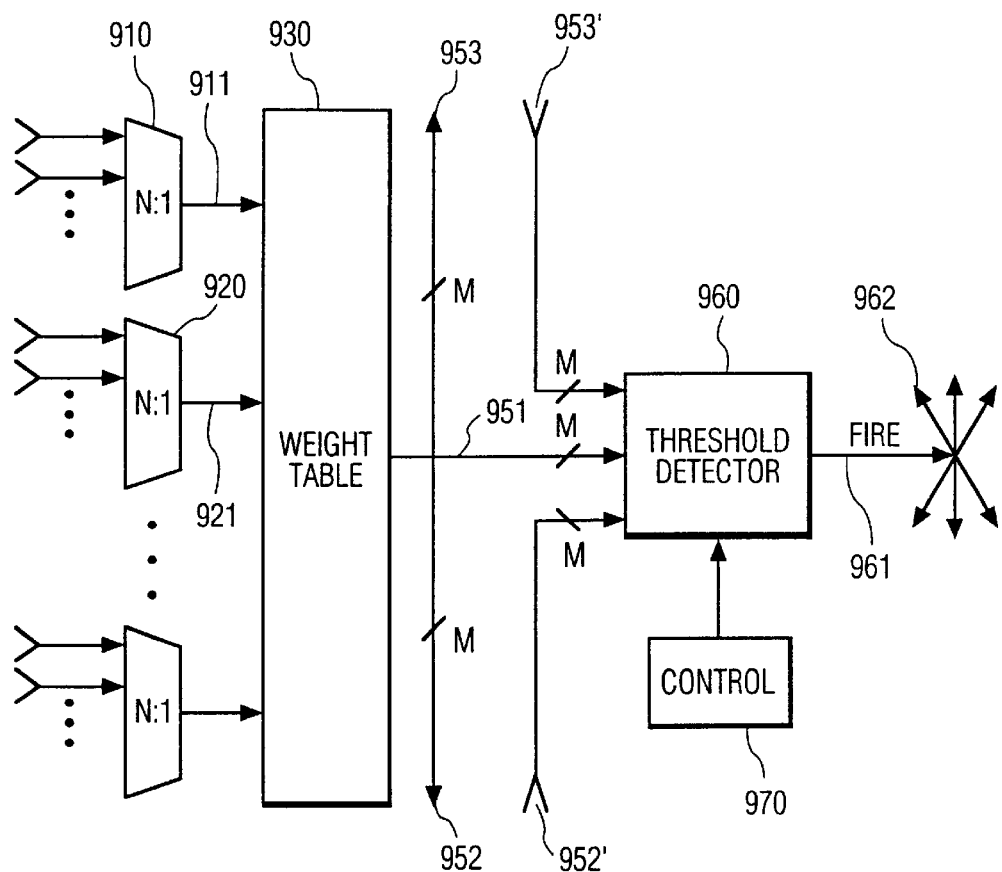
FIG. 11 illustrates an example gate array cell that comprises a core synapse function for neural net designs in accordance with this invention.

Thus, by defining a core functionality that can be used as a building block for a class of applications, such as the programmable half-latch function of the example cell 100 for traditional sequential logic designs, complex designs can be created with a minimal amount of inter-cell routing, and a minimal amount of unused logic for low-level functions. In like manner, the example cell 900 of FIG. 11 is an embodiment of a gate array cell that comprises a core synapse function, and is particularly well suited for neural net designs. The synapse cell 900 includes a plurality of input multiplexers 910, 920, . . . for selecting a plurality of input signals 911, 921, . . . to a programmable weight table 930. Consistent with neural net technology, each input is assigned a weight that can be adjusted during a training session. The output 951 of the programmable weight table 930 is the sum of the programmed weights corresponding to each input signal having a logic value of "1". This sum is a multi-bit value, as indicated by the "M" bit-width indication in FIG. 11 on the sum output 951. In accordance with this invention, similar to the cascade outputs 152, 153 of the cell 100, the sum output 951 of the weight table 930 fans out to adjacent cells (not shown), as indicated by the M-bit output lines 952, 953. A threshold detector 960 receives the sum output 951, as well as sum outputs 952' and 953' from adjacent cells. The control 970 provides the parameters to the threshold detector for determining when to "fire", based on the input sum values 951, 952', and 953'. The control 970, for example, is programmed to control whether the sum inputs 952' or 953' are used in the threshold detection. If, for example, there are a total of five input signals 911, 921, . . . , the adjacent output sum signals 952' and 953' allow for up to ten additional input signals to affect the firing of this synapse cell 900. If five or fewer inputs are connected to this synapse cell 900, the programmable control 970 is programmed to control the threshold detector to ignore the adjacent sum inputs 952', 953'. In like manner, the control 970 is programmed to control the threshold value that the threshold detector 960 uses to determine whether to assert the fire signal 961. In accordance with this invention, the output fire signal 961 fans out 962 to other near and far adjacent cells, similar to the output 160 of cell 100, and forms an input to an input multiplexer 910, 920 of other cells 900. In this manner, a plurality of cells 900 can be efficiently configured to form a neural net. The number of input multiplexers 910, 920, the extent of the fanout 952, 953, the number of sum inputs 952', 953' to the threshold detector 960, the bit-width of the sum signals 951, 952', 953', and other parameters of the synapse cell 900 are determined based on the intended architectural limits typically associated with the design of conventional neural nets. In a preferred embodiment, five input multiplexers 910, 920 are provided, each having five inputs, and the sum output 951 is eight bits wide, and the threshold detector 960 accepts three sum inputs 951, 952', and 953'. Note that, because the weight table 930 is programmable, and the control 970 is programmable, alternative functions may be implemented via the cell 900. In particular, the cell 900 can be programmed as a pass-through fanout device, by programming the weight table to zero-out all inputs except one, assigning a maximum weight to the select input, and programming the control 970 to assert the fire signal 961 when this programmed maximum weight is received as an input. In this manner, the output 961 of cell 900 can use one of the other cells 900 to which it is attached to reach distant cells 900, as required.

In a preferred embodiment, a cell "layout" program is associated with the gate array. The cell layout program allocates the cells of a gate array to each logic element of a design, and effects the appropriate program of each allocated cell. The prewired fanout of each cell output, and the prewired cascade input and output connections, in accordance with this invention, facilitate the allocation and programming task by allowing for the definition of predefined logic blocks, or macros, such as the D-flip-flop logic block of FIG. 3. When a designer includes a D-flip-flop in the design, the cell layout program merely allocates four adjacent cells 100 and schedules the appropriate programming for each multiplexer and lookup-table, as specified above. Note that this allows for a compact and efficient implementation of larger logic blocks, such as flip-flops, without requiring a fixed, predefined allocation of all the gates that are required to effect these larger logic blocks until such larger blocks are actually used in the design. For example, the six cells illustrated in FIG. 2 can be programmed to contain a D-flip-flop, or not, depending upon whether the design requires the allocation/creation of a D-flip-flop. Contrary to conventional larger grained gate array cell architectures that contain a preconfigured D-flip-flop in each cell, for example, each of the four cells comprising the D-flip-flop of FIG. 3 can be allocated to perform other tasks if a D-flip-flop is not required for the particular design being constructed by the layout program. In like manner, the cell 900 allows for the efficient layout of synapses that have a large number of inputs by allocating adjacent cells 900 and suitably programming the control 970 to have the threshold detector 960 fire in dependence upon these numerous inputs. Conversely, synapses having only a few inputs would be allocated to a single cell 900 and suitably programming the control 970 to ignore the adjacent cells, allowing the adjacent cells to be allocated to other synapses.

Figure 4:
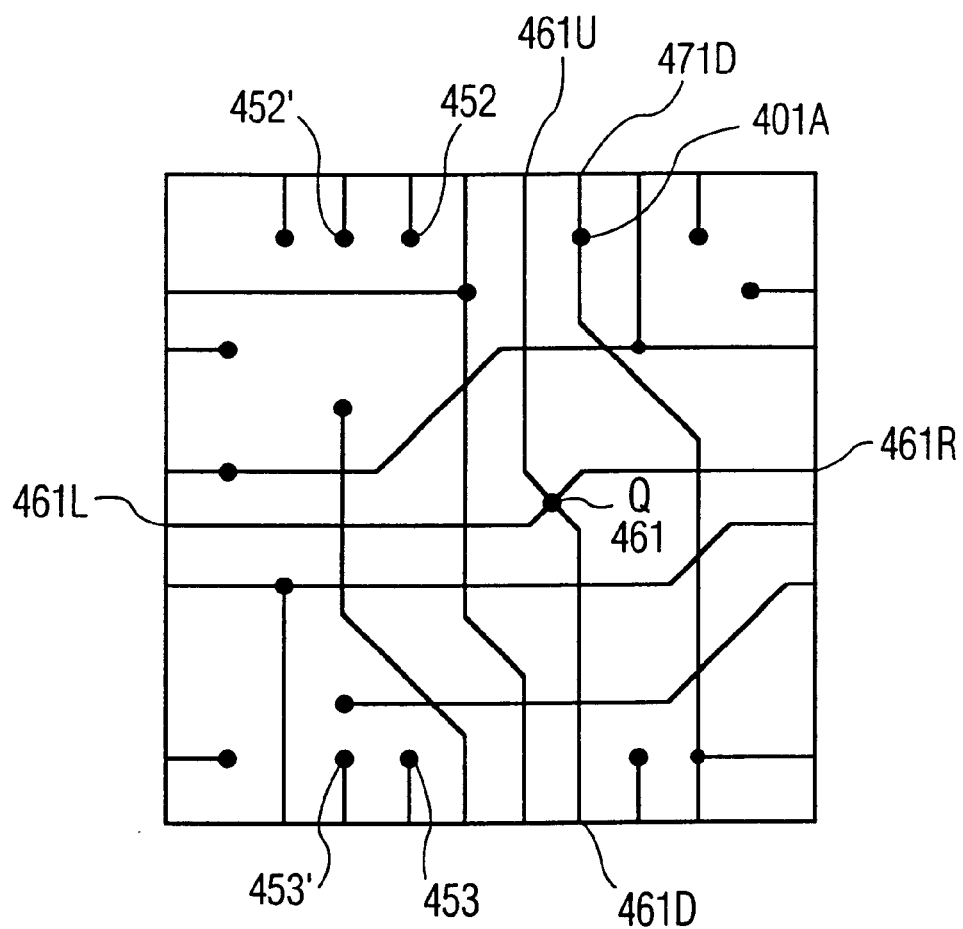
FIG. 4 illustrates an example cell routing layout in accordance with this invention.
Figure 5:
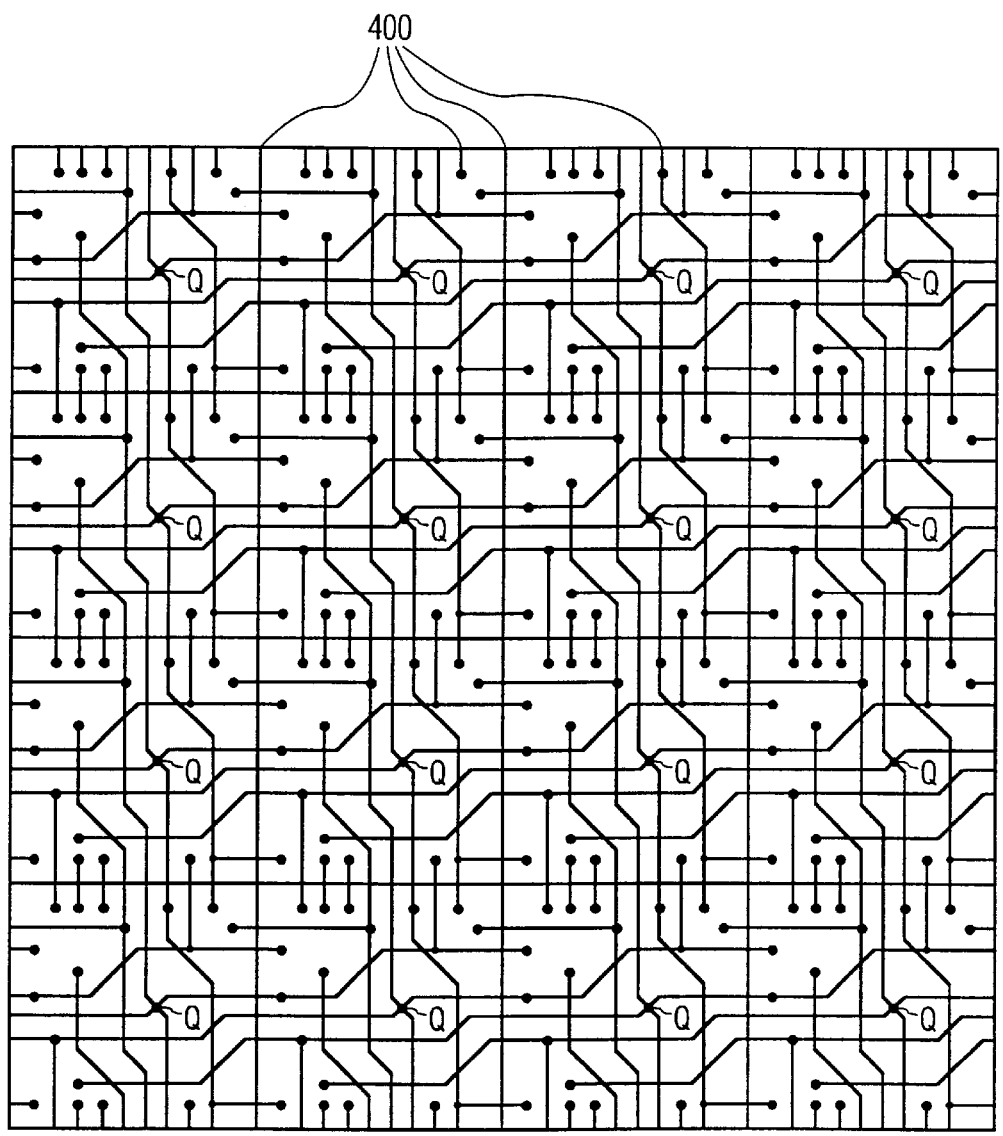
FIG. 5 illustrates an example multi-cell routing layout in accordance with this invention.
Figure 6:
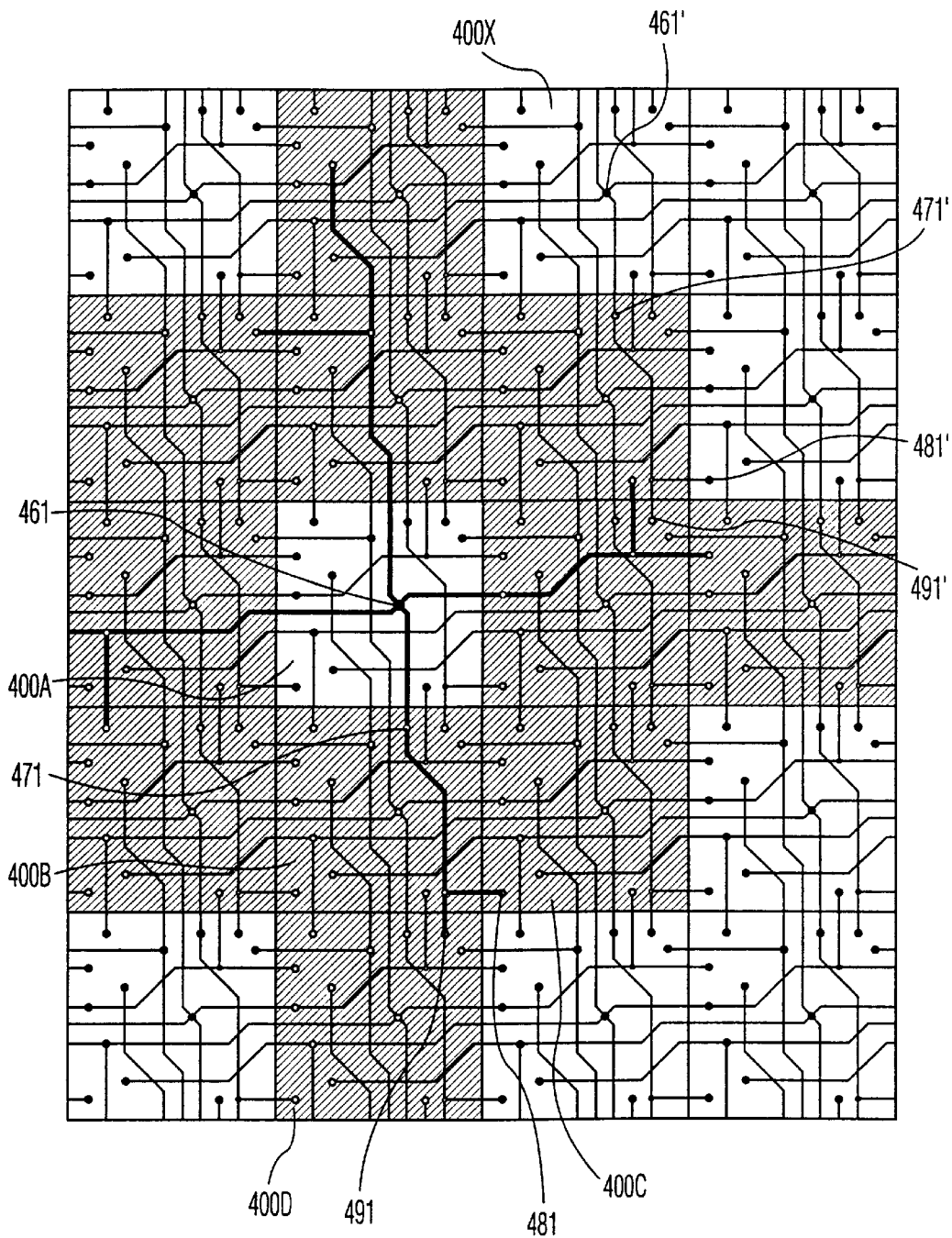
FIG. 6 illustrates an example output fanout routing layout in accordance with this invention.
Figure 10:
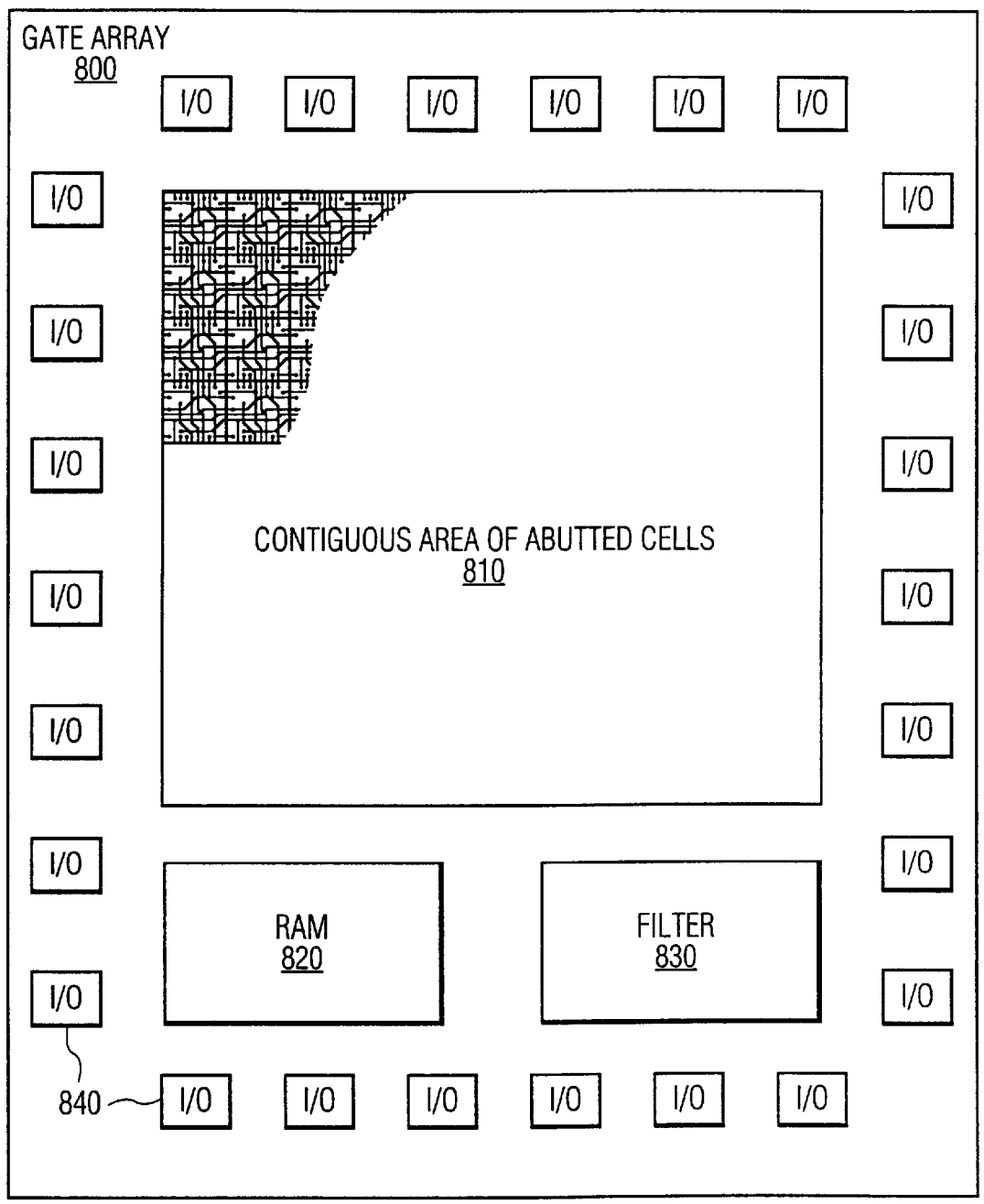
FIG. 10 illustrates an example embodiment of a gate array having an area of contiguous cells in accordance with this invention.

Although the wiring diagrams of FIGS. 2 and 3 imply the use of a routing channel between cells, in accordance with another aspect of this invention, the routing occurs within each cell, and conventional routing channels are eliminated. FIG. 4 illustrates an example integral cell routing layout for a cell 400 in accordance with this invention, and FIGS. 5 and 6 illustrates the abutment of cells to effect a routing architecture that does not require a predefined routing channel. Because logic cells can be allocated to any of the physical cells 400 of FIG. 5, without regard for preallocated routing areas, the contiguous area of abutted cells is termed a "sea of cells". FIG. 10 illustrates an example embodiment of a gate array 800 having an area of contiguous cells 810 in accordance with this invention. Also illustrated in FIG. 10 are conventional input/output cells 840 and other example circuit blocks 820, 830.

Illustrated in FIG. 4 is an output node Q 461 of the cell 400, corresponding to the logic output node 161 of the logic cell 100 of FIG. 1. For ease of reference and understanding, the logic cell 100 of FIG. 1 is used herein to illustrate the principles of the interconnect routing aspects of the invention. As will be evident to one of ordinary skill in the art in view of the subsequent disclosure, other core cells, such as the synapse cell 900 and others, can be similarly configured to effect this aspect of the invention.

Connected to node 461 of cell 400 are four segments of wire, 461R, 461U, 461L, and 461D, that provide for connections from the node 461 to the right, up, left, and down directions, respectively. The jogs in the wires that are introduced across the cell 400 provide for a propagation of the signal on the node 461 to the appropriate nodes on adjoining cells. For example, the wire 461D is vertically aligned with wire 471D in cell 400. Wire 471D is connected to a node 401A, which corresponds to a input signal 101 of the cell 100 of FIG. 1. When this cell 400 is abutted to another cell beneath it, the output signal 461 at 461D in the cell 400 will be connected to an input signal 101 of the other cell, via a corresponding wire 471D and node 401A of the other cell. FIG. 6 illustrates the resultant fanout of a cell's output signal 461 to adjacent cells in accordance with this invention. The bold lines in FIG. 6 illustrate the wires that are electrically connected to node 461 when cells are abutted; each of the cells to which a fanout connection is made is illustrated by shading the cell. Following the downward path, for example, the node 461 of cell 400A is connected, at 471, to an input node of the immediately lower adjacent cell 400B, and to the diagonally adjacent cell 400C, at 481, and farther cell 400D, at 491. As noted above, the prewired routing could extend beyond 491 to connect, for example to a distant cell that is 4, 8, etc. cells down from the cell 400A. Note that the fanout of each output node of each cell is similarly prewired, as illustrated for example by the nodes 471', 481 ', 491 ' corresponding to the output node 461' of cell 400X; the bold outline of the lines connected to node 461 is presented for illustration only. The prewired nodes 452, 453, 452' and 453' of cell 400 in FIG. 4, corresponding to the cascade outputs 152, 153 and cascade inputs 152', 153' of logic cell 100 in FIG. 1, provide the cascade connection between adjacent vertical cells, but are not illustrated in FIG. 6 for clarity.

Note that by providing a contiguous area of abutted cells, as illustrated in FIGS. 5 and 10, a hierarchy of structure is not predefined for the gate array. That is, there are no cells within physically constrained zones, nor zones within quadrants, and so on. Yet, by predefining arrangements of cells that can effect a hierarchy of logic functions, such as the D-flip-flop 300, or a more complex function such as a synchronous counter, the advantages of a hierarchical layout can be achieved by this invention, because the layout hierarchy is created on-demand, corresponding to the requirements of the particular design being programmed. That is, each D-flip-flop, or any other macro defined by the user, that is used in the logic design of the gate array will have a corresponding macro layout structure in the programmed gate array.

Figure 7:
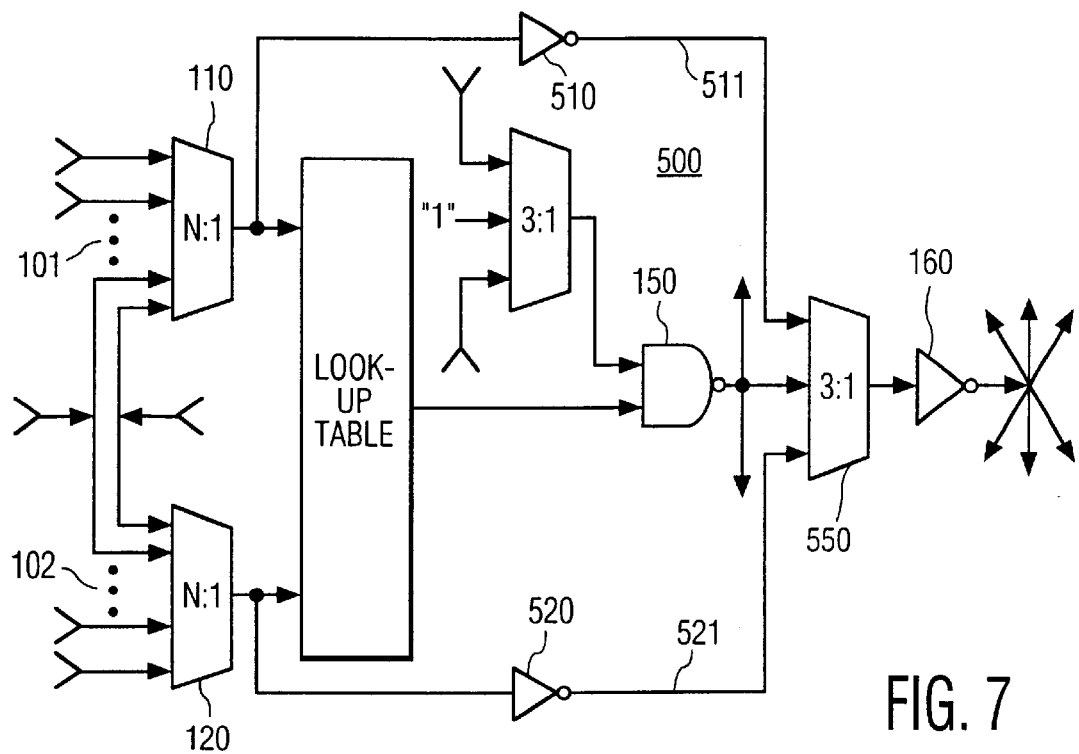
FIG. 7 illustrates an example alternative gate array cell logic diagram in accordance with this invention.

Alternative configurations of cell routing and logic will be evident to one of ordinary skill in the art. FIG. 7, for example, illustrates a cell 500 that is similar to cell 100 of FIG. 1. Cell 500 includes the addition of two buffers 510, 520 and a three input programmable multiplexer 550 that selects whether to use the output 511, 521 of one of the buffers 510, 520, or the cascade gate 150. When the cascade gate 150 is selected, the operation of the cell 500 is identical to cell 100, discussed above. Selection of one of the buffers 510, 520 effects the propagation of the selected input signal 101, 102 via the multiplexers 110, 120, respectively, directly to the output buffer 160. As such, the cell 500 can be configured to provide a "repeater" function that reconstitutes and propagates an input signal 101, 102 to the output 161, similar to the pass-through fan-out function described above for cell 900. This repeater function can be utilized to distribute the loading on a high fanout gate, such as a local clock generator, or to avoid signal degradation as the signal is propagated across long routing distances.

Figure 8:
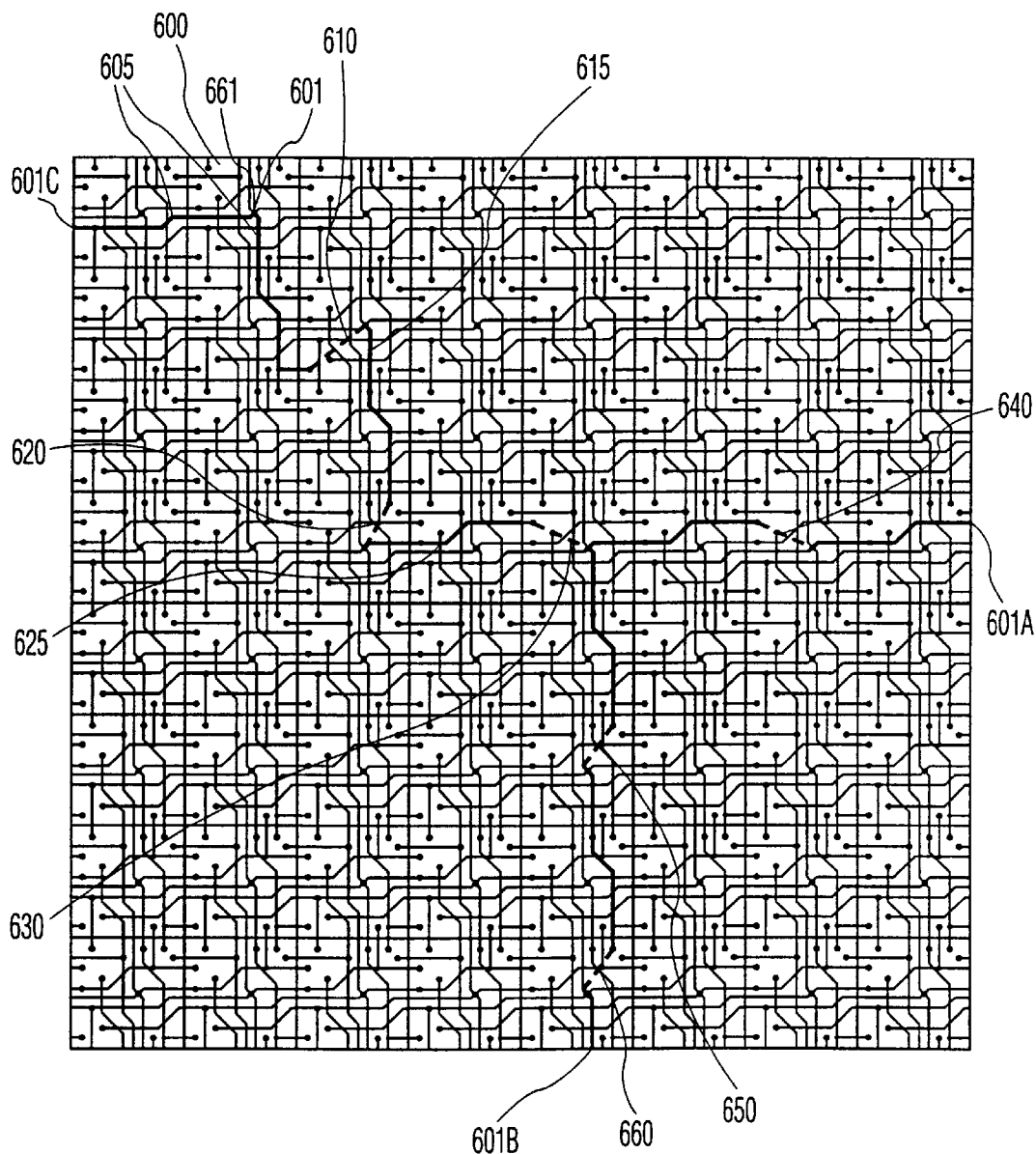
FIG. 8 illustrates an example routing path in accordance with this invention.

FIG. 8 illustrates an example routing path that utilizes the aforementioned repeater function of the cell 500 to propagate a signal over extended distances in accordance with this invention. In FIG. 8, it is assumed that a signal 601 that is produced at output node 661 of cell 600 needs to be propagated across a multitude of cells to be made available at locations 601A, 601B, and 601C. The first segment of routing 605 utilizes a fanout path of the output node 661 of the cell 600 to reach location 601C. At cell 610, the routing path from the output node 661 terminates. As indicated by the dashed line at cell 610, the cell 610 is configured as a repeater cell, to propagate the signal 601 to the output node of cell 610. The segment 615 of prewired routing from the output of cell 610 terminates at cell 620, which is also configured as a repeater cell, to propagate the signal 601 to the output node of cell 620. This sequence of prewired routing segment and repeater cells is repeated via repeater cells 630, 640 to location 601A, and via repeater cells 630, 650, 660 to location 601B. Thus, in this manner, a signal can be propagated across the gate array without using a dedicated routing channel, and with reconditioning at each repeater cell. Note that in a preferred embodiment, the prewired fanout of each cells output extends to a distance of 8 cells or more, and thus the number of repeater cell allocations will be occur substantially less often than shown in the example of FIG. 8.

Figure 9:
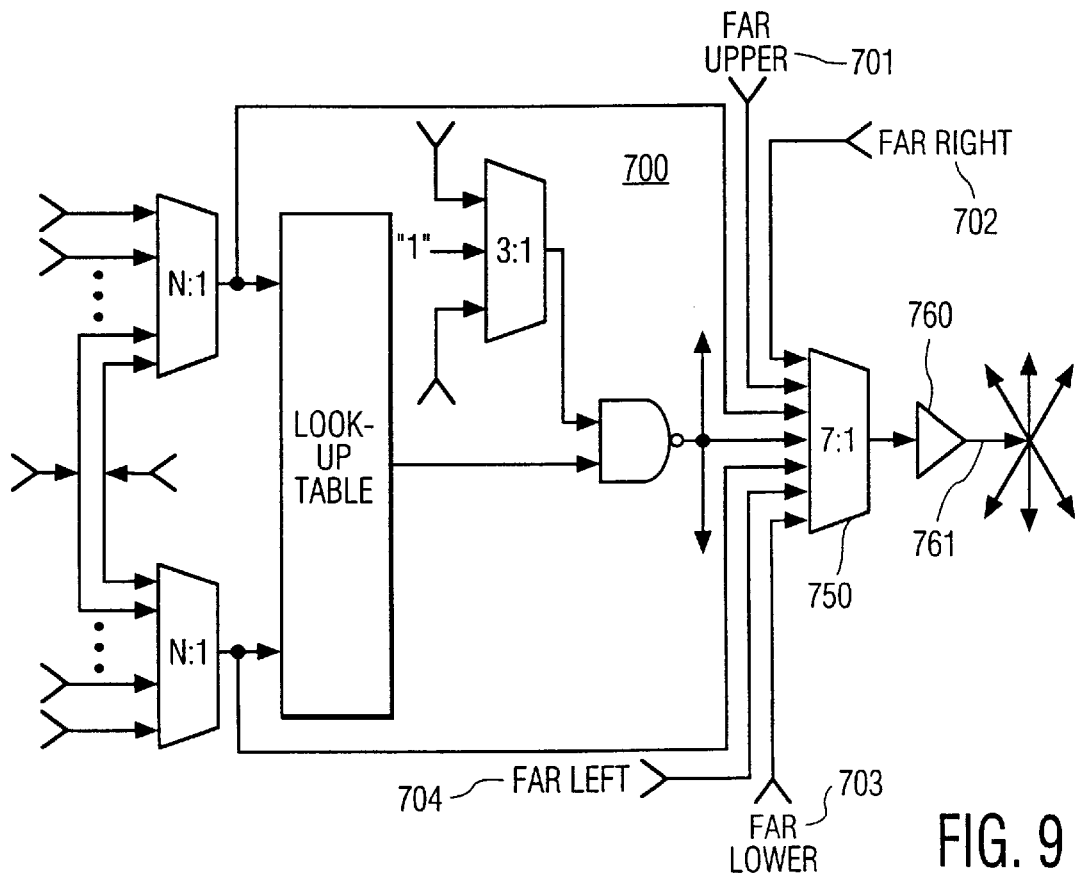
FIG. 9 illustrates another example alternative gate array cell logic diagram in accordance with this invention.

The foregoing merely illustrates the principles of the invention. It will thus be appreciated that those skilled in the art will be able to devise various arrangements which, although not explicitly described or shown herein, embody the principles of the invention and are thus within its spirit and scope. For example, FIG. 9 illustrates an alternative cell design 700 that provides for an improved repeater cell performance. As compared to the cell 500 of FIG. 7, the cell 700 has a seven input multiplexer 750, compared to the three input multiplexer 550 of cell 500. The additional inputs to this multiplexer 750 are the output signals from cells that are separated by a long vertical or horizontal distance, as indicated by the far upper 701, far right 702, far lower 703, and far left 704 input signal designations. The buffers 510 and 520 of cell 500 are absent in cell 700, and the output buffer 760 in cell 700 is non-inverting. As is common in the art, the non-inverting buffer 760 includes two inverters (not shown); the first inverter is sized to provide minimal loading on the input line 701–704, and the second inverter is sized to provide sufficient drive capacity to the output line 761.

Other alternatives are also apparent. For example, the particular logic configuration of the gate array cell 100 may be modified, using for example, a NOR gate as the cascade logic device 150, or another programmable lookup-table as the cascade device 150. Similarly, the output buffer 160 can be a "transparent buffer", or mere wire, provided that the cascade buffer has sufficient drive capability to drive the output node fanout. These and other configuration modifications will be evident to one of ordinary skill in the art in view of this invention, and are included within the scope of the following claims.

I claim:

1. A programmable gate array integrated circuit comprising a plurality of cells,
    each cell of the plurality of cells being configured to accept cell input signals via cell input terminals including:
        a first multiplexer that is programmable to accept one of a first plurality of cell input signals and provide therefrom a first logic input,
        a second multiplexer that is programmable to accept one of a second plurality of cell input signals and provide therefrom a second logic input,
        a programmable weight table, operably coupled to the first multiplexer and the second multiplexer, that provides a first sum output in dependence upon the first logic input, a programmed first weight associated with the first logic input, the second logic input, and a programmed second weight associated with the second logic input, and
        a threshold detector that provides an output signal in dependence upon the first sum output.

2. The programmable gate array of claim 1, wherein each cell of the plurality of cells further includes
    a plurality of cell routing paths that operably couple the output signal to the first plurality of cell input signals of the at least one other cell when the cell is abutted to the at least one other cell.

3. The programmable gate array of claim 2, wherein the operable coupling of the logic output of each cell of the plurality of cells is effected via the plurality of cell routing paths only.

4. The programmable gate array of claim 1, wherein the plurality of cells form a single contiguous area of cells within the programmable gate array.

5. The programmable gate array of claim 1, wherein each cell of the plurality of cells further includes
    a programmable control device operably coupled to the threshold detector, such that the threshold detector provides the output signal in further dependence upon a programmed output from the programmable control device.

6. The programmable gate array of claim 1, wherein the threshold detector of each cell of the plurality of cells is operably coupled to at least one sum output from an other cell, and the threshold detector provides the output signal in further dependence upon the at least one sum output from the other cell.

* * * * *